United States Patent
Kim et al.

(10) Patent No.: US 10,256,911 B2
(45) Date of Patent: Apr. 9, 2019

(54) HARMONIC GENERATION AND PHASE SENSITIVE AMPLIFICATION USING A BRAGG REFLECTION WAVEGUIDE

(71) Applicant: Fujitsu Limited, Kawasaki-shi, Kanagawa (JP)

(72) Inventors: Inwoong Kim, Allen, TX (US); Youichi Akasaka, Plano, TX (US); Jeng-Yuan Yang, Garland, TX (US); Motoyoshi Sekiya, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/875,050

(22) Filed: Jan. 19, 2018

(65) Prior Publication Data

US 2018/0159629 A1 Jun. 7, 2018

Related U.S. Application Data

(62) Division of application No. 14/863,170, filed on Sep. 23, 2015, now Pat. No. 9,923,634.

(51) Int. Cl.

| | | |
|---|---|---|
| *H01S 3/00* | (2006.01) | |
| *G02F 1/377* | (2006.01) | |
| *G02F 1/39* | (2006.01) | |
| *H01S 5/50* | (2006.01) | |
| *G02B 6/12* | (2006.01) | |
| *G02B 6/124* | (2006.01) | |
| *H04B 10/291* | (2013.01) | |
| *H04B 10/079* | (2013.01) | |

(Continued)

(52) U.S. Cl.
CPC ......... *H04B 10/2912* (2013.01); *G02F 1/377* (2013.01); *G02F 1/39* (2013.01); *H01S 3/00* (2013.01); *H04B 10/0797* (2013.01); *G02B 6/12* (2013.01); *G02B 6/124* (2013.01); *G02B 6/42* (2013.01); *H01S 5/1032* (2013.01); *H01S 5/50* (2013.01); *H04B 10/2519* (2013.01)

(58) Field of Classification Search
CPC .... H04B 10/04; H04B 10/06; H04B 10/2912; H04B 10/0797; H04B 10/2519; H01S 5/50; H01S 5/1032; G02B 6/17; G02B 6/42; G02B 6/124
USPC ........................... 398/160, 161, 180, 210, 87
See application file for complete search history.

(56) References Cited

U.S. PATENT DOCUMENTS 5,184,247 A * 2/1993 Schimpe ............... H01S 5/5045
 359/339
5,861,970 A * 1/1999 Tatham ..................... H01S 5/50
 398/150

(Continued)

OTHER PUBLICATIONS

Ritwick Das, "Ultra-broadband optical parametric amplification by tailoring the group-velocity dispersion of BRW" Journal of Physics, pp. 1-7, Oct. 6, 2009.

(Continued)

*Primary Examiner* — Kenneth N Vanderpuye
*Assistant Examiner* — Abbas H Alagheband
(74) *Attorney, Agent, or Firm* — Baker Botts L.L.P.

(57) ABSTRACT

Methods and systems enable amplifying optical signals using a Bragg reflection waveguide (BRW) having second order optical nonlinearity to generate an optical pump by injection locking. The BRW may also be used for parametric amplification of optical signals using the optical pump. Feedback phase-power control may be performed to maximize output power.

14 Claims, 8 Drawing Sheets

(51) Int. Cl.
*H04B 10/2519* (2013.01)
*H01S 5/10* (2006.01)
*G02B 6/42* (2006.01)

(56) References Cited

U.S. PATENT DOCUMENTS

| | | | | |
|---|---|---|---|---|
| 5,894,492 | A * | 4/1999 | Welch | H01S 5/026 359/344 |
| 5,914,978 | A | 6/1999 | Welch | |
| 5,991,070 | A * | 11/1999 | Zanoni | H01S 3/094003 359/340 |
| 6,122,299 | A | 9/2000 | DeMars | |
| 6,151,158 | A * | 11/2000 | Takeda | H01S 3/10023 359/337.12 |
| 6,353,499 | B2 * | 3/2002 | Zanoni | H01S 3/094003 359/341.3 |
| 6,704,138 | B2 * | 3/2004 | Dijaili | H01S 5/1032 359/344 |
| 6,731,426 | B2 * | 5/2004 | Yeniay | H01S 3/06754 359/341.3 |
| 7,095,772 | B1 * | 8/2006 | Delfyett | H01S 5/50 359/333 |
| 7,110,170 | B2 | 9/2006 | Lee | |
| 7,190,861 | B2 * | 3/2007 | Knopp | G02B 6/12 359/333 |
| 7,209,282 | B2 * | 4/2007 | Kim | G02F 1/3534 359/326 |
| 7,215,836 | B2 * | 5/2007 | Vakhshoori | H01S 3/302 359/341.1 |
| 7,565,084 | B1 * | 7/2009 | Wach | H04B 10/506 398/183 |
| 7,715,677 | B2 * | 5/2010 | Helmy | G02B 6/122 385/129 |
| 8,059,966 | B2 * | 11/2011 | Igarashi | H04B 10/299 398/176 |
| 8,229,304 | B1 * | 7/2012 | Pepper | H04B 10/61 398/162 |
| 8,290,316 | B2 | 10/2012 | Molin | |
| 8,681,827 | B2 * | 3/2014 | Maleki | G02F 2/00 372/21 |
| 9,025,630 | B2 * | 5/2015 | Gerard | H01S 5/34 372/43.01 |
| 9,263,855 | B2 | 2/2016 | McComb | |
| 9,287,993 | B1 * | 3/2016 | Adleman | H04B 10/2575 |
| 2003/0095326 | A1 | 5/2003 | Dijaili | |
| 2005/0201675 | A1 | 9/2005 | Knopp | |
| 2005/0213194 | A1 | 9/2005 | Kim | |
| 2005/0265647 | A1 | 12/2005 | Vakhshoori | |
| 2007/0009205 | A1 * | 1/2007 | Maleki | G02B 6/122 385/27 |
| 2007/0104443 | A1 | 5/2007 | Helmy | |
| 2007/0177388 | A1 | 8/2007 | Wang | |
| 2010/0195677 | A1 * | 8/2010 | Fermann | H01S 3/0057 372/6 |
| 2011/0019179 | A1 | 1/2011 | Molin | |
| 2012/0294319 | A1 | 11/2012 | Maleki | |
| 2013/0258453 | A1 * | 10/2013 | Arahira | G02F 1/39 359/330 |
| 2014/0043674 | A1 * | 2/2014 | Takasaka | H01S 3/10023 359/334 |
| 2014/0119695 | A1 | 5/2014 | Nappez | |
| 2014/0269788 | A1 | 9/2014 | McComb | |
| 2016/0141838 | A1 | 5/2016 | Gillin | |

OTHER PUBLICATIONS

"Bragg Reflection Waveguides" Pochi Yeh and Amnon Yariv, Optics communication vol. 19, No. 3, Dec. 1976.

Payam Abolghasem, "Single-sided Bragg reflection waveguides with multilayer core for monolithic semiconductor parametric devices" vol. 29, No. 6, Jun. 2012.

Sergei Zhukovsky, "Bragg reflection waveguides as integrated sources of entangled photon pairs Bragg reflection waveguides as integrated sources of entangled photon pairs", vol. 29, No. 9, Sep. 2012.

* cited by examiner

HARMONIC GENERATION AND PHASE SENSITIVE AMPLIFICATION USING A BRAGG REFLECTION WAVEGUIDE

CROSS REFERENCE TO RELATED APPLICATION

This application is a divisional application of U.S. patent application Ser. No. 14/863,170 filed Sep. 23, 2015, the contents of which is hereby incorporated in its entirety by reference.

BACKGROUND

Field of the Disclosure

The present disclosure relates generally to optical communication networks and, more particularly, to harmonic generation and phase sensitive amplification using a Bragg reflection waveguide (BRW).

Description of the Related Art

Telecommunication, cable television and data communication systems use optical networks to rapidly convey large amounts of information between remote points. In an optical network, information is conveyed in the form of optical signals through optical fibers. Optical fibers may comprise thin strands of glass capable of communicating the signals over long distances. Optical networks often employ modulation schemes to convey information in the optical signals over the optical fibers. Such modulation schemes may include phase-shift keying (PSK), frequency-shift keying (FSK), amplitude-shift keying (ASK), and quadrature amplitude modulation (QAM).

In PSK, the information carried by the optical signal may be conveyed by modulating the phase of a reference signal, also known as a carrier wave. The information may be conveyed by modulating the phase of the signal itself using differential phase-shift keying (DPSK) or binary phase shift keying (BPSK). In QAM, the information carried by the optical signal may be conveyed by modulating both the amplitude and phase of the carrier wave. PSK may be considered a subset of QAM, wherein the amplitude of the carrier waves is maintained as a constant.

PSK and QAM signals may be represented using a complex plane with real and imaginary axes on a constellation diagram. The points on the constellation diagram representing symbols carrying information may be positioned with uniform angular spacing around the origin of the diagram. The number of symbols to be modulated using PSK and QAM may be increased and thus increase the information that can be carried. The number of signals may be given in multiples of two. As additional symbols are added, they may be arranged in uniform fashion around the origin. PSK signals may include such an arrangement in a circle on the constellation diagram, meaning that PSK signals have constant power for all symbols. QAM signals may have the same angular arrangement as that of PSK signals, but include different amplitude arrangements. QAM signals may have their symbols arranged around multiple circles, meaning that the QAM signals include different power for different symbols. This arrangement may decrease the risk of noise as the symbols are separated by as much distance as possible. A number of symbols "m" may thus be used and denoted "m-PSK" or "m-QAM."

Examples of PSK and QAM with a different number of symbols can include binary PSK (BPSK or 2-PSK) using two phases at 0° and 180° (or 0 and $\pi$) on the constellation diagram; or quadrature PSK (QPSK, 4-PSK, or 4-QAM) using four phases at 0°, 90°, 180°, and 270° (or 0, $\pi/2$, $\pi$, and 3 $\pi/2$). Phases in such signals may be offset. Each of 2-PSK and 4-PSK signals may be arranged on the constellation diagram.

M-PSK signals may further be polarized using techniques such as dual-polarization QPSK (DP-QPSK), wherein separate m-PSK signals are multiplexed by orthogonally polarizing the signals. M-QAM signals may also be polarized using techniques such as dual-polarization 16-QAM (DP-16-QAM), wherein separate m-QAM signals are multiplexed by orthogonally polarizing the signals.

Optical networks may also include various optical elements, such as amplifiers, dispersion compensators, multiplexer/demultiplexer filters, wavelength selective switches, optical switches, couplers, etc. to perform various operations within the network. In particular, optical networks may include optical amplifiers for amplifying optical signals to enable a greater reach of the optical signal.

SUMMARY

In one aspect, a disclosed first method is for amplifying optical signals. The first method may include receiving an optical signal for amplification, the optical signal including a carrier frequency and having a first optical power. The first method may include transmitting the optical signal through a Bragg reflection waveguide (BRW) having second order optical nonlinearity while an electrical current is injected into the BRW to enable optical gain of a pump frequency within the BRW. Within the BRW in the first method, an optical pump at the pump frequency is injection locked by seed from second harmonic generation from the optical signal, and a second optical power of the optical pump is increased by the electrical current injected and stimulated emission. In the first method, the optical pump and the optical signal may be phase locked to each other. Within the BRW in the first method, the first optical power of the optical signal is increased by optical parametric amplification. The first method may further include outputting, from the BRW, the optical signal having the first optical power increased.

In any of the disclosed embodiments of the first method, the optical signal may be a modulated laser beam at the carrier frequency. In the first method, the optical pump may be at least partially reflected internally at the BRW.

In another aspect, a disclosed first optical amplifier, includes a BRW including electrodes mounted to the BRW to enable current injection. In the first optical amplifier, the BRW is enabled to receive an optical signal for amplification, the optical signal including a carrier frequency and having a first optical power, and transmit the optical signal through the BRW while an electrical current is injected into the BRW using the electrodes. Within the BRW in the first optical amplifier, an optical pump at the pump frequency is injection locked by seed from second harmonic generation from the optical signal, a second optical power of the optical pump is increased by the electrical current injected and stimulated emission, and the first optical power of the optical signal is increased by optical parametric amplification. In the first optical amplifier, the optical pump and the optical signal are phase locked to each other. In the first optical amplifier, the BRW is enabled to output, from the BRW, the optical signal having the first optical power increased.

In any of the disclosed embodiments of the first optical amplifier, the optical signal may be a modulated laser beam at the carrier frequency. In any of the disclosed embodiments of the first optical amplifier, the optical pump may be at least partially reflected internally at the BRW.

In another aspect, a disclosed second method is for amplifying optical signals. The second method may include receiving an optical signal for amplification, the optical signal being modulated with data using BPSK or DPSK, and transmitting the optical signal through a first BRW having second order optical nonlinearity while an electrical current is injected into the first BRW to enable optical gain of a pump frequency within the first BRW. Within the first BRW in the second method, an optical pump at the pump frequency is injection locked by seed from second harmonic generation from the optical signal, where the optical pump does not include the data modulated, and a first optical power of the optical pump is increased by the electrical current injected and stimulated emission. The second method includes isolating the optical pump generated by the first BRW using a first bandpass filter, and combining the optical pump isolated with the optical signal. In the second method, a phase adjustment is applied to the optical signal to create a combined signal and the optical signal has a second optical power in the combined signal. The second method may include transmitting the combined signal through a second BRW having second order optical nonlinearity, while the second optical power of the optical signal is increased.

In any of the disclosed embodiments, the second method may further include isolating the optical signal having the second optical power increased using a second bandpass filter, and measuring the second optical power generated by the second bandpass filter. In any of the disclosed embodiments, the second method may include using the second optical power measured to perform feedback control of the phase adjustment to maximize the second optical power.

In a further aspect, a disclosed second optical amplifier includes a first stage and a second stage. In the second optical amplifier, the first stage includes a first BRW having second order optical nonlinearity for receiving an optical signal for amplification, the optical signal being modulated with data using BPSK or DPSK. In the second optical amplifier, the optical signal is transmitted through the first BRW while an electrical current is injected into the first BRW. Within the first BRW in the second optical amplifier, an optical pump at a pump frequency for the optical signal is injection locked by seed from second harmonic generation from the optical signal, and a first optical power of the optical pump is increased by the electrical current injected and stimulated emission. In the second optical amplifier, the optical pump does not include the data modulated. In the second optical amplifier, the first stage further includes a first bandpass filter for isolating the optical pump generated by the first BRW, a phase delay control applied to the optical signal along a separate optical path from the first BRW, an optical coupler to combine the optical pump isolated with the optical signal output from the phase delay control to generate the combined signal, such that the optical signal has a second optical power in the combined signal. In the second stage, the second optical amplifier includes a second BRW having second order optical nonlinearity for receiving the combined signal. In the second optical amplifier, the second optical power of the optical signal is increased in the second BRW.

In any of the disclosed embodiments of the second optical amplifier, the second stage may include a second bandpass filter for isolating the optical signal generated by the second BRW, and a photodetector to measure the second optical power generated by the second bandpass filter. In any of the disclosed embodiments, the second optical amplifier may include a feedback control loop using the second optical power measured to control the phase delay control to maximize the second optical power.

In yet another aspect, a disclosed third method is for amplifying optical signals. The third method may include receiving an optical signal for amplification, the optical signal being modulated with data using non-uniform QPSK or non-uniform DQPSK, and transmitting the optical signal through a first BRW having second order optical nonlinearity while an electrical current is injected into the first BRW to enable optical gain of a pump frequency within the first BRW. Within the first BRW in the third method, an optical pump at the pump frequency is injection locked by seed from second harmonic generation from the optical signal, and a first optical power of the optical pump is increased by the electrical current injected and stimulated emission. The third method may include isolating the optical pump generated by the first BRW using a first bandpass filter, applying a phase adjustment to the optical signal received, where the optical signal has a second optical power, and combining the optical pump output by the first bandpass filter with the optical signal after phase adjustment to create an in-phase combined signal. The third method may further include transmitting the in-phase combined signal through a second BRW having second order optical nonlinearity to increase an in-phase portion of the second optical power, combining the optical pump output by the first bandpass filter with the optical signal after phase adjustment and a phase shift to create a quadrature-phase combined signal, and transmitting the quadrature-phase combined signal through a third BRW having second order optical nonlinearity to increase a quadrature-phase portion of the second optical power.

In any of the disclosed embodiments, the third method may further include isolating an in-phase amplified signal generated by the second BRW using a second bandpass filter, isolating a quadrature-phase amplified signal generated by the third BRW using a third bandpass filter, combining the in-phase amplified signal and the quadrature phase amplified signal to generate an amplified optical signal having a third optical power, and measuring the third optical power from the amplified optical signal. In any of the disclosed embodiments, the third method may further include using the third optical power measured to perform feedback control of the phase adjustment to maximize the third optical power. In any of the disclosed embodiments of the third method, the non-uniform QPSK may include QPSK and BPSK, while the non-uniform DQPSK may include DQPSK and DPSK.

In yet a further aspect, a disclosed third optical amplifier includes a first stage and a second stage. In the third optical amplifier, the first stage includes a first BRW having second order optical nonlinearity for receiving an optical signal for amplification, the optical signal being modulated with data using non-uniform QPSK or non-uniform DQPSK. In the first stage of the third optical amplifier, the optical signal may be transmitted through the first BRW while an electrical current is injected into the BRW. Within the first BRW in the third optical amplifier, an optical pump at the pump frequency is injection locked by seed from second harmonic generation from the optical signal, and a first optical power of the optical pump is increased by the electrical current injected and stimulated emission. The first stage of the third optical amplifier may further include a first bandpass filter for isolating the optical pump generated by the first BRW, and a phase delay control applied to the optical signal along a separate optical path from the first BRW, where the optical signal has a second optical power. The second stage of the third optical amplifier may include a first optical coupler to combine the optical pump output by the first bandpass filter with the optical signal output from the phase delay control to generate an in-phase combined signal, a second BRW having second order optical nonlinearity for receiving the in-phase combined signal, while an in-phase portion of the second optical power is increased in the second BRW, a second optical coupler to combine the optical pump output by the first bandpass filter with the optical signal output from the phase delay control and subject to a phase shift to generate an quadrature-phase combined signal, and a third BRW having second order optical nonlinearity for receiving the quadrature-phase combined signal. In the second stage of the third amplifier, a quadrature-phase portion of the second optical power is increased in the third BRW In any of the disclosed embodiments of the second optical amplifier, the second stage may include a second bandpass filter for isolating an in-phase amplified signal generated by the second BRW, a third bandpass filter for isolating a quadrature-phase amplified signal generated by the third BRW, a second optical coupler to combine the in-phase amplified signal and the quadrature phase amplified signal to generate an amplified optical signal having a third optical power, and a photodetector to measure the third optical power.

In any of the disclosed embodiments, the second optical amplifier may further include a feedback control loop using the third optical power measured to control the phase delay control to maximize the third optical power. In the second optical amplifier, the non-uniform QPSK may include QPSK and BPSK, while the non-uniform DQPSK may include DQPSK and DPSK.

Additional disclosed aspects for phase-sensitive optical amplification using a BRW include an optical communication system and an optical transport network, as described herein.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
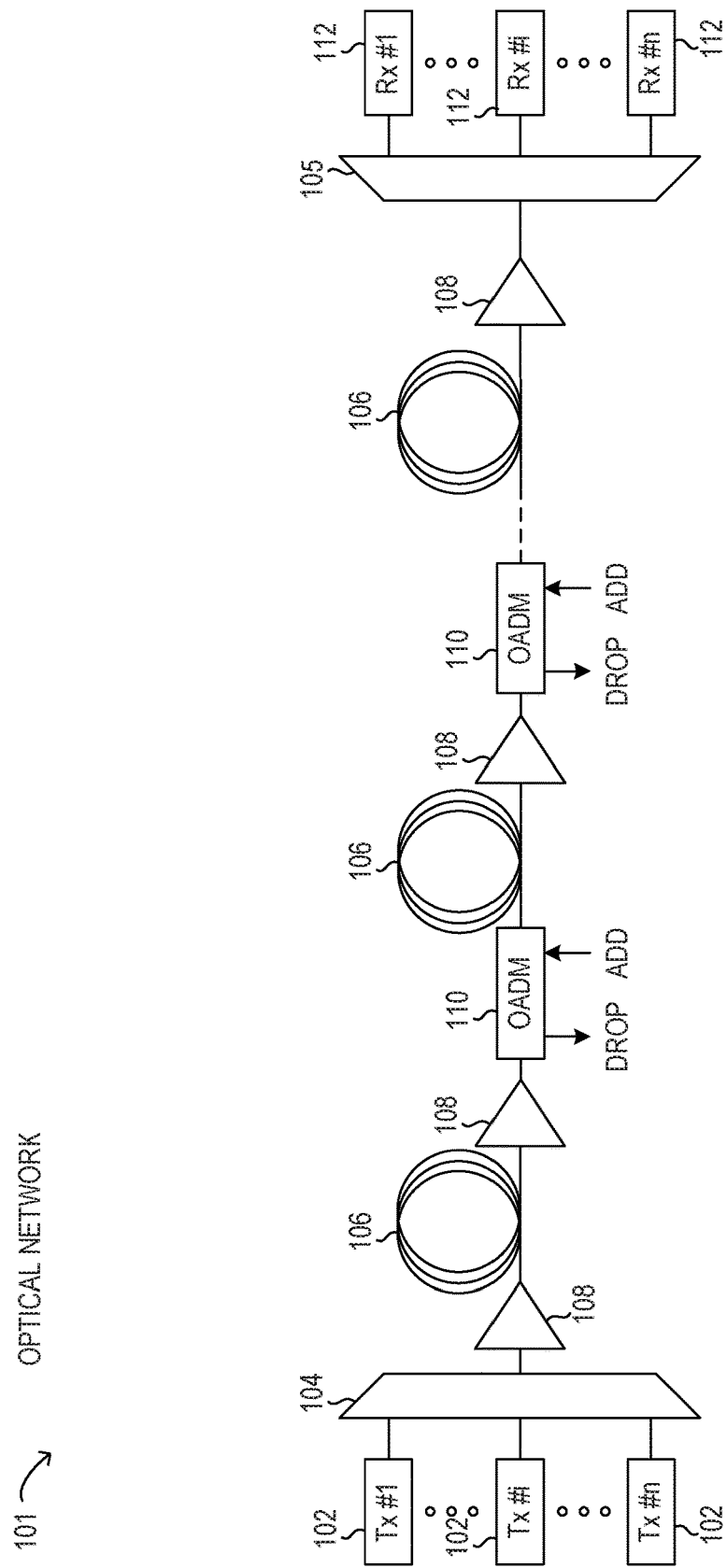
FIG. 1 is a block diagram of selected elements of an embodiment of an optical network.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), device "12-1" refers to an instance of a device class, which may be referred to collectively as devices "12" and any one of which may be referred to generically as a device "12". In the figures and the description, like numerals are intended to represent like elements.

Referring now to the drawings, FIG. 1 illustrates an example embodiment of optical network 101, which may represent an optical communication system. Optical network 101 may include one or more optical fibers 106 to transport one or more optical signals communicated by components of optical network 101. The network elements of optical network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical network 101 may comprise a point-to-point optical network with terminal nodes, a ring optical network, a mesh optical network, or any other suitable optical network or combination of optical networks. Optical network 101 may be used in a short-haul metropolitan network, a long-haul inter-city network, or any other suitable network or combination of networks. The capacity of optical network 101 may include, for example, 100 Gbit/s, 400 Gbit/s, or 1 Tbit/s. Optical fibers 106 comprise thin strands of glass capable of communicating the signals over long distances with very low loss. Optical fibers 106 may comprise a suitable type of fiber selected from a variety of different fibers for optical transmission. Optical fibers 106 may include any suitable type of fiber, such as a Single-Mode Fiber (SMF), Enhanced Large Effective Area Fiber (E-LEAF), or TrueWave® Reduced Slope (TW-RS) fiber.

Optical network 101 may include devices to transmit optical signals over optical fibers 106. Information may be transmitted and received through optical network 101 by modulation of one or more wavelengths of light to encode the information on the wavelength. In optical networking, a wavelength of light may also be referred to as a channel that is included in an optical signal (also referred to herein as a "wavelength channel"). Each channel may carry a certain amount of information through optical network 101.

To increase the information capacity and transport capabilities of optical network 101, multiple signals transmitted at multiple channels may be combined into a single wideband optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical network 101 may transmit disparate channels using WDM or some other suitable multi-channel multiplexing technique, and to amplify the multi-channel signal.

Optical network 101 may include one or more optical transmitters (Tx) 102 to transmit optical signals through optical network 101 in specific wavelengths or channels. Transmitters 102 may comprise a system, apparatus or device to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical network 101.

Multiplexer 104 may be coupled to transmitters 102 and may be a system, apparatus or device to combine the signals transmitted by transmitters 102, e.g., at respective individual wavelengths, into a WDM signal.

Optical amplifiers 108 may amplify the multi-channeled signals within optical network 101. Optical amplifiers 108 may be positioned before or after certain lengths of fiber 106. Optical amplifiers 108 may comprise a system, apparatus, or device to amplify optical signals. For example, optical amplifiers 108 may comprise an optical repeater that amplifies the optical signal. This amplification may be performed with opto-electrical or electro-optical conversion. In some embodiments, optical amplifiers 108 may comprise an optical fiber doped with a rare-earth element to form a doped fiber amplification element. When a signal passes through the fiber, external energy may be applied in the form of an optical pump (or simply 'pump') to excite the atoms of the doped portion of the optical fiber, which increases the intensity of the optical signal. As an example, optical amplifiers 108 may comprise an erbium-doped fiber amplifier (EDFA).

OADMs 110 may be coupled to optical network 101 via fibers 106. OADMs 110 comprise an add/drop module, which may include a system, apparatus or device to add or drop optical signals (i.e., at individual wavelengths) from fibers 106. After passing through an OADM 110, an optical signal may travel along fibers 106 directly to a destination, or the signal may be passed through one or more additional OADMs 110 and optical amplifiers 108 before reaching a destination.

In certain embodiments of optical network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

As shown in FIG. 1, optical network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical network 101 may transmit and carry a forty (40) channel DWDM signal. Demultiplexer 105 may divide the single, forty channel DWDM signal into forty separate signals according to the forty different channels.

In FIG. 1, optical network 101 may also include receivers 112 coupled to demultiplexer 105. Each receiver 112 may receive optical signals transmitted at a particular wavelength or channel, and may process the optical signals to obtain (e.g., demodulate) the information (i.e., data) that the optical signals contain. Accordingly, network 101 may include at least one receiver 112 for every channel of the network.

Optical networks, such as optical network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant.

Additionally, polarization division multiplexing (PDM) technology may enable achieving a greater bit rate for information transmission. PDM transmission comprises modulating information onto various polarization components of an optical signal associated with a channel. The polarization of an optical signal may refer to the direction of the oscillations of the optical signal. The term "polarization" may generally refer to the path traced out by the tip of the electric field vector at a point in space, which is perpendicular to the propagation direction of the optical signal.

In an optical network, such as optical network 101 in FIG. 1, it is typical to refer to a management plane, a control plane, and a transport plane (sometimes called the physical layer). A central management host (not shown) may reside in the management plane and may configure and supervise the components of the control plane. The management plane includes ultimate control over all transport plane and control plane entities (e.g., network elements). As an example, the management plane may consist of a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS) which handles one or more network elements from the perspective of the elements, a network management system (NMS) which handles many devices from the perspective of the network, and an operational support system (OSS) which handles network-wide operations.

Modifications, additions or omissions may be made to optical network 101 without departing from the scope of the disclosure. For example, optical network 101 may include more or fewer elements than those depicted in FIG. 1. Also, as mentioned above, although depicted as a point-to-point network, optical network 101 may comprise any suitable network topology for transmitting optical signals such as a ring, a mesh, or a hierarchical network topology.

As discussed above, optical amplifiers 108 are used to increase optical power of optical signals in an optical network. In particular, a Bragg reflection waveguide (BRW), which has second order nonlinearity, may be used for parametric amplification of an optical signal. An optical pump (also referred to simply as 'pump' herein) for parametric amplification may be generated within the BRW by inducing lasing at a pump frequency using current injection. However, when phase sensitive amplification (PSA) by a parametric process is desired, typically an external seed laser is used that is phase locked to the carrier phase of the optical signal.

As will be described in further detail, methods and systems are disclosed herein for a phase-sensitive optical amplifier (PSA) that enables generation of a seed for an optical pump, as well as parametric amplification, using a BRW. The lasing optical frequency of a BRW can be controlled using various methods. For example, non-stoichiometric aluminum gallium arsenide $Al_xGa_{1-x}As$ has been used for Bragg reflector layers in a BRW. By applying band gap engineering, the stoichiometric value for x may be used to design a particular laser frequency in a BRW. In this manner, a BRW having a gain peak near a second harmonic of a carrier frequency of an optical signal may be engineered, such that a pump frequency is very close to the second harmonic frequency, which is double the carrier frequency (or a second harmonic wavelength at half the carrier wavelength). Thus, the pump frequency will become locked to the second harmonic frequency. Then, the amplitude of the pump at the pump frequency will grow due to current injection and stimulated emission. Further aspects of BRW design, such as a desired longitudinal mode may be used to achieve a particular laser frequency. Additionally, injection current may be applied to tune the laser frequency as well as a phase matching condition in the BRW. Accordingly, the lasing frequency of an optical pump generated using a BRW may be engineered and controlled to be close to a second harmonic of the optical signal to be amplified by phase-sensitive amplification.

When the optical signal has a carrier tone, such as an unmodulated carrier wave or modulated with data using on-off-keying, then the second harmonic of the carrier tone will serve as a seed for injection locking of the pump within the BRW. A 'seed' for injection locking refers to a photon donated for injection locking and the seed can result in stimulated emission at the same optical frequency. Even when the second harmonic generation (SHG) is inefficient and produces a very weak seed in terms of optical power, the seed can serve for injection locking nonetheless. Once injection locking begins, the optical pump and the optical signal will be inherently phase locked to each other within the BRW. The optical pump will then begin to perform phase-sensitive amplification of the optical signal within the BRW.

When the optical signal does not have a carrier tone, such as with BPSK or DPSK modulation, the SHG process within the BRW will remove the modulated data and the SHG will be a very monochromatic carrier tone which can serve for injection locking of the optical pump within the BRW.

When the optical signal is modulated using QPSK or DQPSK, a residual carrier may be generated in the optical signal by controlling the amplitude and bias of a QPSK or DQPSK modulator at the transmitter. As a result, the SHG will also have a residual carrier tone for injection locking of the optical pump within the BRW. Alternatively, a non-uniform modulation scheme may be used to generate the residual carrier, which may not appear with solely QPSK modulation. In one exemplary embodiment, QPSK can be used such that 90% of symbols have 0 or 180 degree phase modulation and 10% of symbols have 90 or 270 degree phase modulation, which may generate the residual carrier. It will be understood that other non-uniform modulation schemes may be used with QPSK or DQPSK modulation. In another exemplary embodiment, a certain number of the symbols in the optical signal may be modulated using BPSK, such as 90% QPSK and 10% BPSK, which will also create the residual carrier tone in the SHG of the optical signal. Once generated, the residual carrier tone will promote injection locking of the pump within the BRW.

Figure 2:
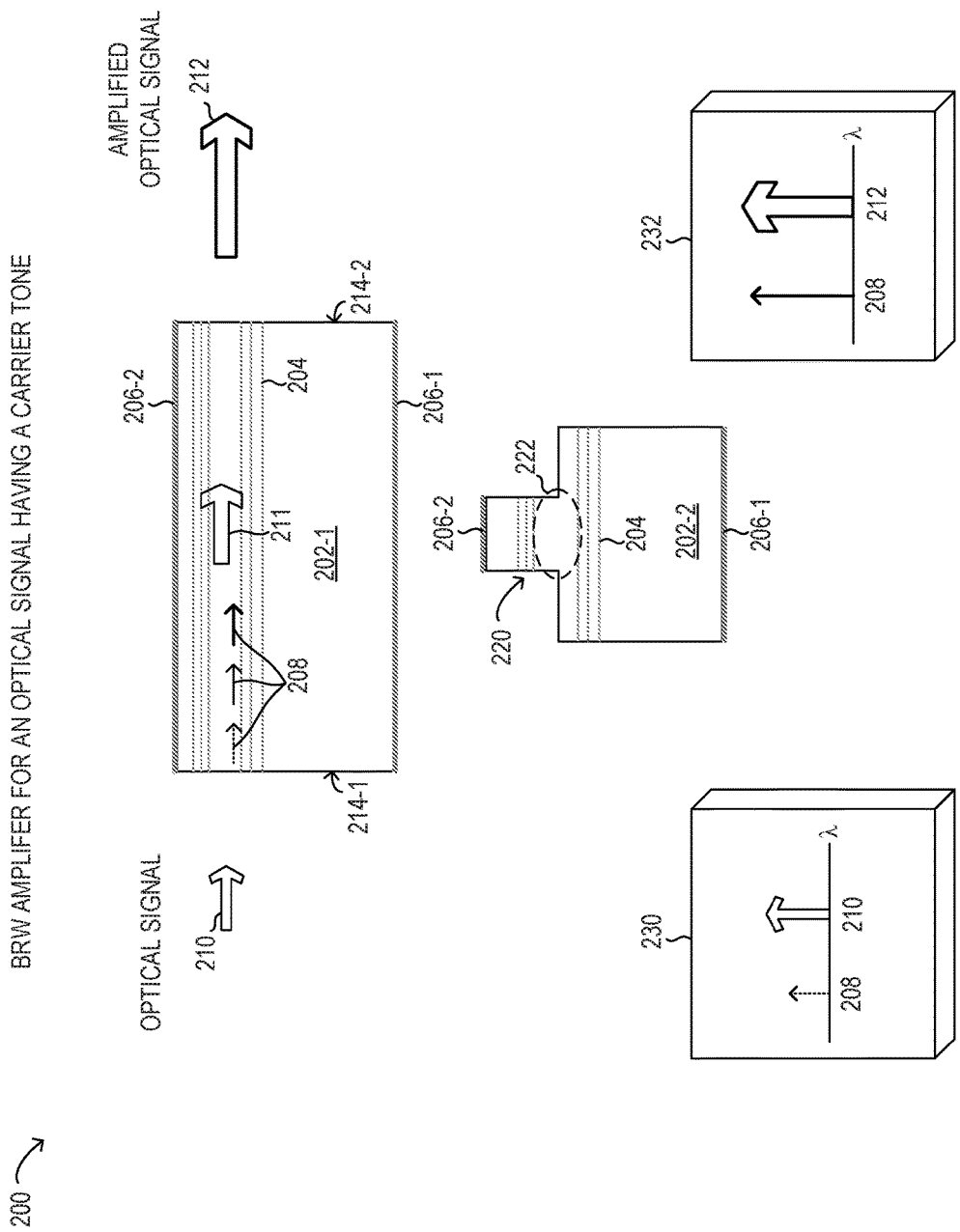
FIG. 2 is a block diagram of selected elements of an embodiment of an optical amplifier using a BRW.

Referring now to FIG. 2, selected elements of an example embodiment of a BRW amplifier 200 to provide optical phase-sensitive amplification for an optical signal 210 having a carrier tone are depicted. As shown, BRW amplifier includes BRW 202, which may represent selected elements of an embodiment of amplifier 108 (see FIG. 1). FIG. 2 is a schematic illustration and is not drawn to scale.

In FIG. 2, BRW 202 is shown in a side view as 202-1 and a facet view as 202-2. Within BRW 202, Bragg reflectors 204 are shown as various material layers, which may be engineered for different applications and lasing frequencies, as described above. Additionally, electrodes 206 are applied to a top and bottom surface of BRW 202 to enable current injection, shown as electrodes 206-1 and 206-2. Furthermore, front facet 214-1 and rear facet 214-2 are coated with a partial reflective layer that may be transmissive for optical signal 210, but yet reflective for pump 208, such that pump 208 is internally reflected within BRW 202. In facet view 202-2 of BRW 202, ridge waveguide 220 and optical channel 222 where light passes through and is subject to non-linear interactions are shown.

In operation of BRW 202 with optical signal 210 having a carrier tone, as optical signal 210 is introduced, some photons in optical signal 210 are converted to photons of pump 208 by SHG and serve as a seed for injection locking. Then, the intensity (optical power) of injection locked pump 208 increases by current injection and stimulated emission. As the intensity of pump 208 increases, photons of pump 208 result in parametric amplification of optical signal 211 within BRW, and result in amplified optical signal 212 being output by BRW 212. Also shown in FIG. 2 are spectra 230 and 232. Spectra 230 shows how optical signal 210 results in seeding of pump 208 by SHG. Spectra 232 shows parametric amplification of amplified output signal 212 by pump 208.

Figure 3:
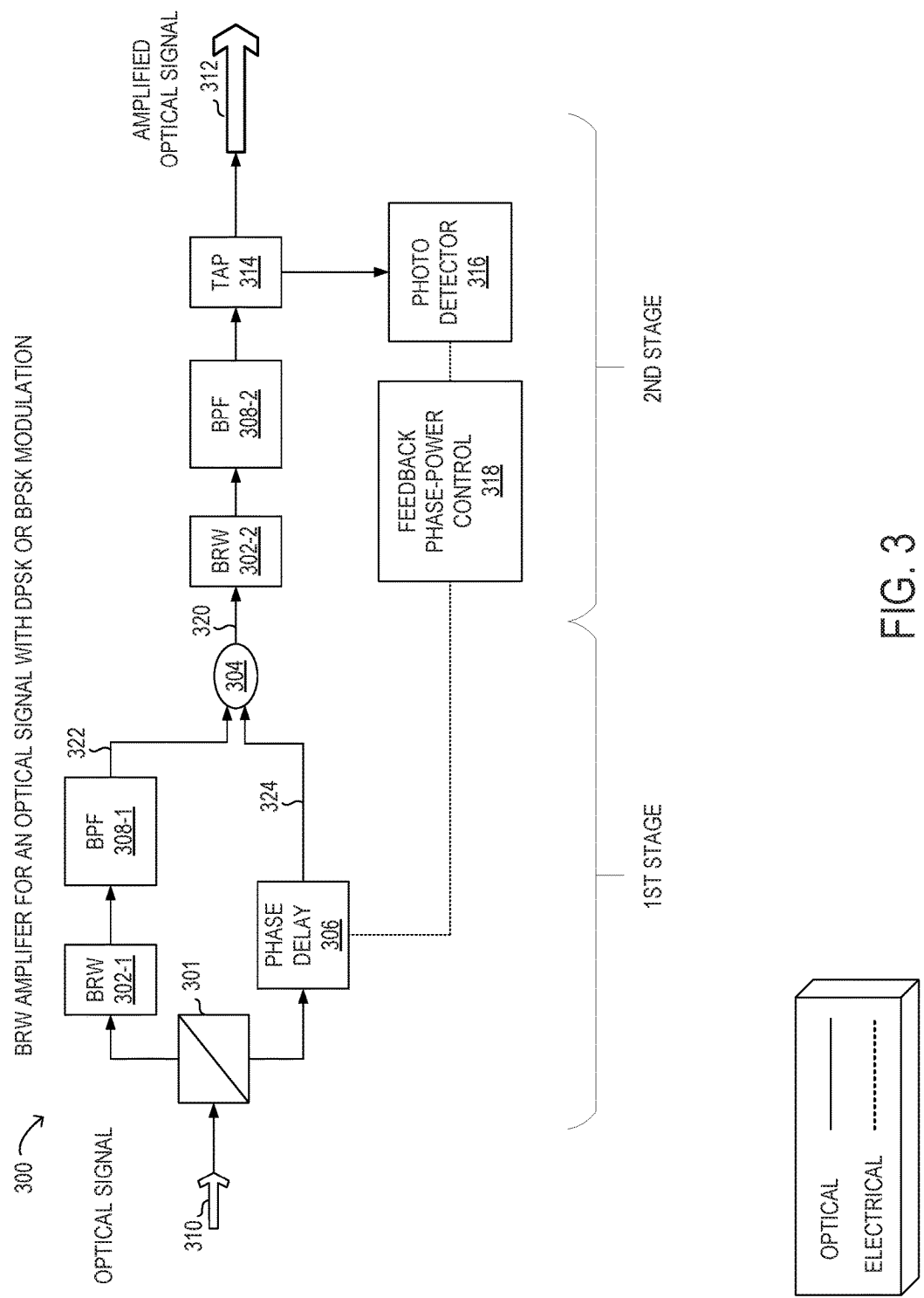
FIG. 3 is a block diagram of selected elements of an embodiment of an optical amplifier using two BRWs.

Referring now to FIG. 3, selected elements of an example embodiment of a BRW amplifier 300 to provide optical phase-sensitive amplification for an optical signal 310 being modulated with DPSK or BPSK. As shown, BRW amplifier 300 includes two BRWs 302-1 and 302-2, and may represent selected elements of an embodiment of amplifier 108 (see FIG. 1). FIG. 3 is a schematic illustration and is not drawn to scale. BRW amplifier 300 may include a first stage for generation of a combined signal 320, and a second stage for generation of amplified optical signal 312.

In BRW amplifier 300, optical signal 310 is split at beam splitter 301. A first portion of optical signal 310 is directed to BRW 302-1, where pump 208 is generated using injection locking, as described above. At bandpass filter (BPF) 308-1, the optical signal 310 may be filtered out to generate optical pump 322, which comprises pump 208 isolated from other light frequencies. Meanwhile, a second portion of optical signal 310 is directed to phase delay 306, which applies a variable phase delay under control of feedback phase-power control 318, as described below, to output phase-locked optical signal 324, since the optical power of amplified optical signal 312 depends on the phase relation between optical pump 322 and optical signal 310 in the optical parametric amplification performed by BRW amplifier 300. Then, phase-locked optical signal 324 is combined with optical pump 322 at optical coupler 304 to generate a combined signal 320, of which phase-locked optical signal 324 is phase locked to optical pump 322. Then, combined signal 320 is directed to a second BRW 302-2. At BRW 302-2 parametric amplification of phase-locked optical signal 324 in combined signal 320 occurs, and so, the optical power of optical signal 310 is increased to generate amplified optical signal 312, after filtering at BPF 308-2 to remove optical pump 322. At optical tap 314, a portion of amplified optical signal 312 may be captured and sent to photodetector 316, which may be a photodiode. Photodetector 316 may output an electrical signal that is indicative of the optical power of amplified optical signal 312 to feedback phase-power control 318, which may then regulate the output power, for example to a maximum output power, by sending a control signal to phase delay 306 to adjust the phase of optical signal 310 accordingly.

Figure 4:
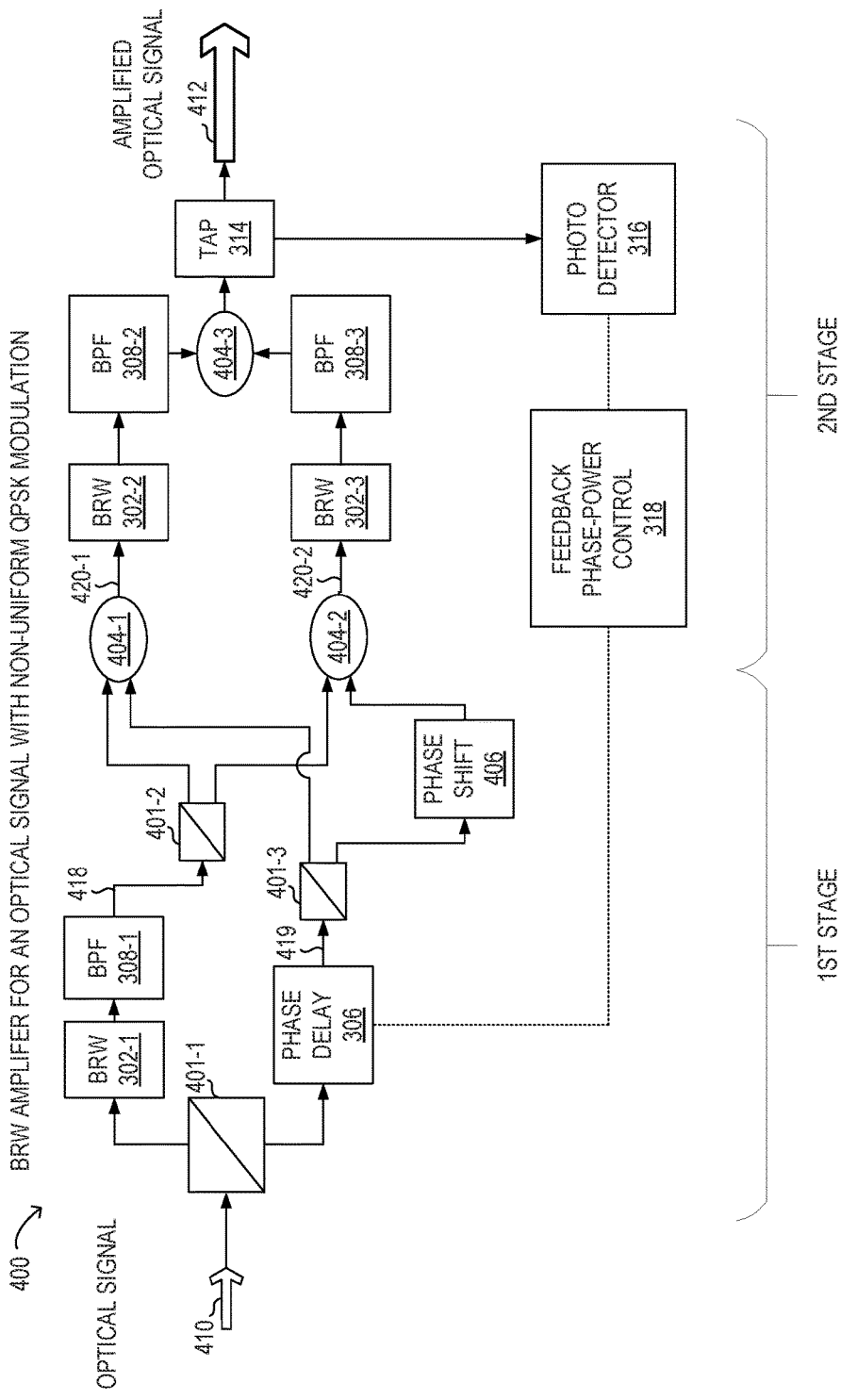
FIG. 4 is a block diagram of selected elements of an embodiment of an optical amplifier using three BRWs.

Referring now to FIG. 4, selected elements of an example embodiment of a BRW amplifier 400 to provide optical phase-sensitive amplification for an optical signal 410 being modulated with QPSK-based modulation, such as non-uniform QPSK or non-uniform DQPSK discussed previously. As shown, BRW amplifier 400 includes three BRWs 302-1, 302-2 and 302-3, and may represent selected elements of an embodiment of amplifier 108 (see FIG. 1). FIG. 4 is a schematic illustration and is not drawn to scale. BRW amplifier 400 may include a first stage for generation of an in-phase combined signal 420-1 and a quadrature-phase combined signal 420-2, and a second stage for generation of amplified optical signal 412.

In the first stage of BRW amplifier 400, optical signal 410 is split at beam splitter 401-1. A first portion of optical signal 410 is directed to BRW 302-1, where pump 208 is generated using injection locking, as described above. At bandpass filter (BPF) 308-1, the optical signal 410 may be filtered out to generate optical pump 418, which includes pump 208 isolated from other light frequencies. Meanwhile, a second portion of optical signal 410 is directed to phase delay 306, which applies a variable phase delay under control of feedback phase-power control 318, as described above in FIG. 2, to generate phase-locked optical signal 419. Optical pump 418 is then split by beam splitter 401-2, while phase-locked optical signal 419 is split by beam splitter 401-3. At optical coupler 404-1, optical pump 418 is combined with phase-locked optical signal 419 to generate in-phase combined signal 420-1. At optical coupler 404-2, optical pump 418 is combined with phase-locked optical signal 419 that is subject to phase shift 406 ($\pi/2$) to generate quadrature-phase combined signal 420-2.

In the second stage of BRW amplifier 400, in-phase combined signal 420-1 is directed to BRW 302-2 and BPF 308-2 to generate an in-phase portion of optical signal 410 having increased optical power, while quadrature-phase combined signal 420-2 is directed to BRW 302-3 and BPF 308-3 to generate a quadrature-phase portion of optical signal 410 having increased optical power. At optical coupler 404-3, the in-phase and quadrature-phase portions are combined to generate amplified optical signal 412. At optical tap 314, a portion of amplified optical signal 412 may be captured and sent to photodetector 316, which may be a photodiode. Photodetector 316 may output an electrical signal that is indicative of the optical power of amplified optical signal 412 to feedback phase-power control 318, which may then regulate the output power, for example to a maximum output power, by sending a control signal to phase delay 306 to adjust the phase of optical signal 410 to provide phase-locked optical signal 419.

Figure 5:
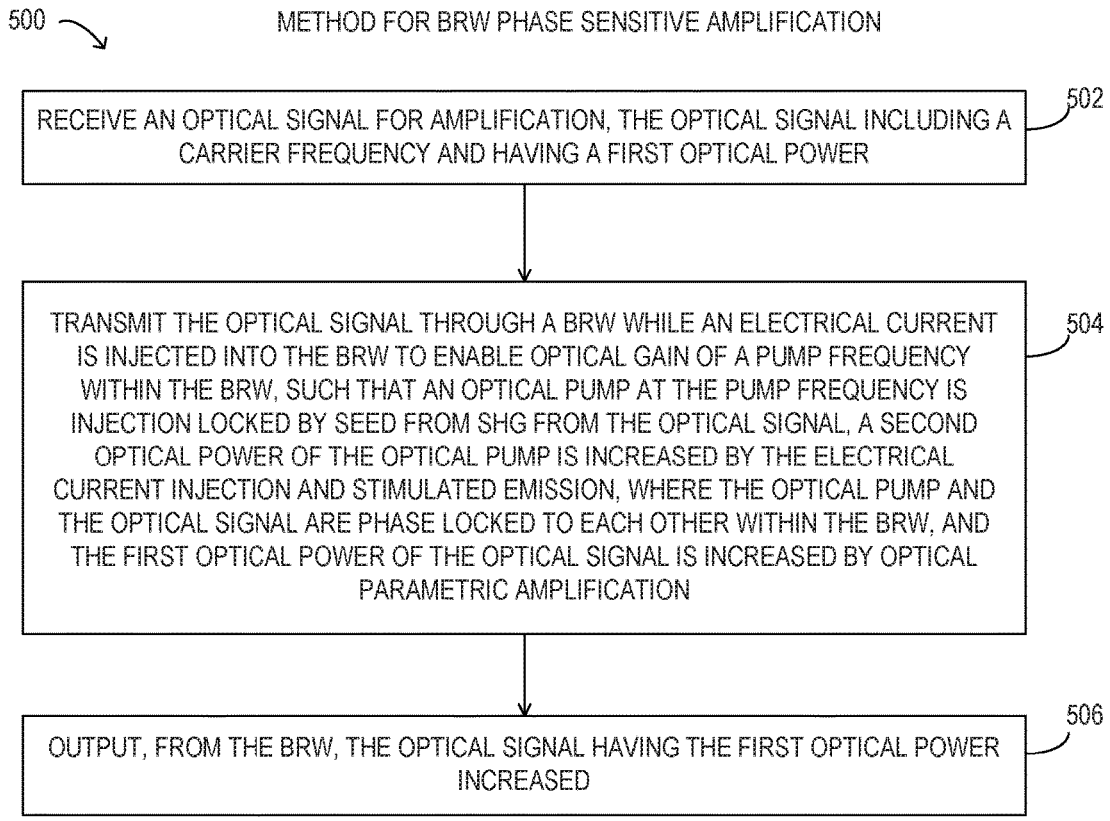
FIG. 5 is a flow diagram of selected elements of an embodiment of a method for BRW phase-sensitive optical amplification.

Referring now to FIG. 5, a block diagram of selected elements of an embodiment of method 500 for BRW phase-sensitive amplification, as described herein, is depicted in flowchart form. Method 500 may be performed using BRW amplifier 200 in FIG. 2. It is noted that certain operations described in method 500 may be optional or may be rearranged in different embodiments.

Method 500 may begin, at step 502, by receiving an optical signal for amplification, the optical signal including a carrier frequency and having a first optical power. At step 504, the optical signal is transmitted through a BRW while an electrical current is injected into the BRW to enable optical gain of a pump frequency within the BRW, such that an optical pump at the pump frequency is injection locked by seed from SHG from the optical signal, a second optical power of the optical pump is increased by the electrical current injection and stimulated emission, where the optical pump and the optical signal are phase locked to each other within the BRW, and the first optical power of the optical signal is increased by optical parametric amplification. At step 506, the optical signal having the first optical power increased is output from the BRW.

Figure 6:
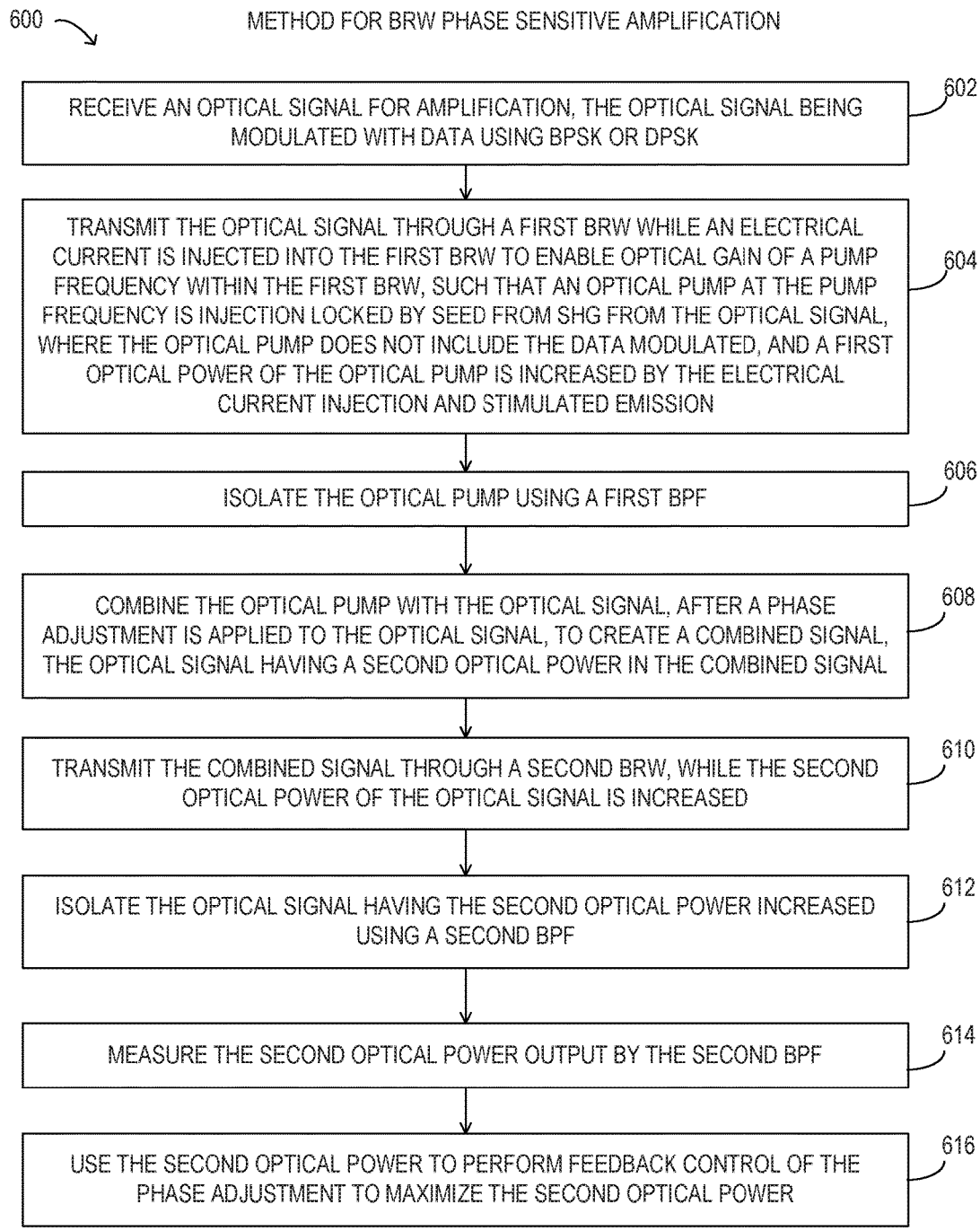
FIG. 6 is a flow diagram of selected elements of an embodiment of a method for BRW phase-sensitive optical amplification.

Referring now to FIG. 6, a block diagram of selected elements of an embodiment of method 600 for BRW phase-sensitive amplification, as described herein, is depicted in flowchart form. Method 600 may be performed using BRW amplifier 300 in FIG. 3. It is noted that certain operations described in method 600 may be optional or may be rearranged in different embodiments.

Method 600 may begin at step 602 by receiving an optical signal for amplification, the optical signal being modulated with data using BPSK or DPSK. At step 604, the optical signal is transmitted through a first BRW while an electrical current is injected into the first BRW to enable optical gain of a pump frequency within the first BRW, such that an optical pump at the pump frequency is injection locked by seed from SHG from the optical signal, where the optical pump does not include the data modulated, and a first optical power of the optical pump is increased by the electrical current injection and stimulated emission. At step 606, the optical pump is isolated using a first bandpass filter. At step 608, the optical pump is combined with the optical signal, after a phase adjustment is applied to the optical signal, to create a combined signal, the optical signal having a second optical power in the combined signal. At step 610, the combined signal is transmitted through a second BRW, while the second optical power of the optical signal is increased. At step 612, the optical signal having the second optical power increased is isolated using a second bandpass filter. At step 614, the second optical power generated by the second bandpass filter is measured. At step 616, the second optical power is used to perform feedback control of the phase adjustment to maximize the second optical power.

Figure 7A:
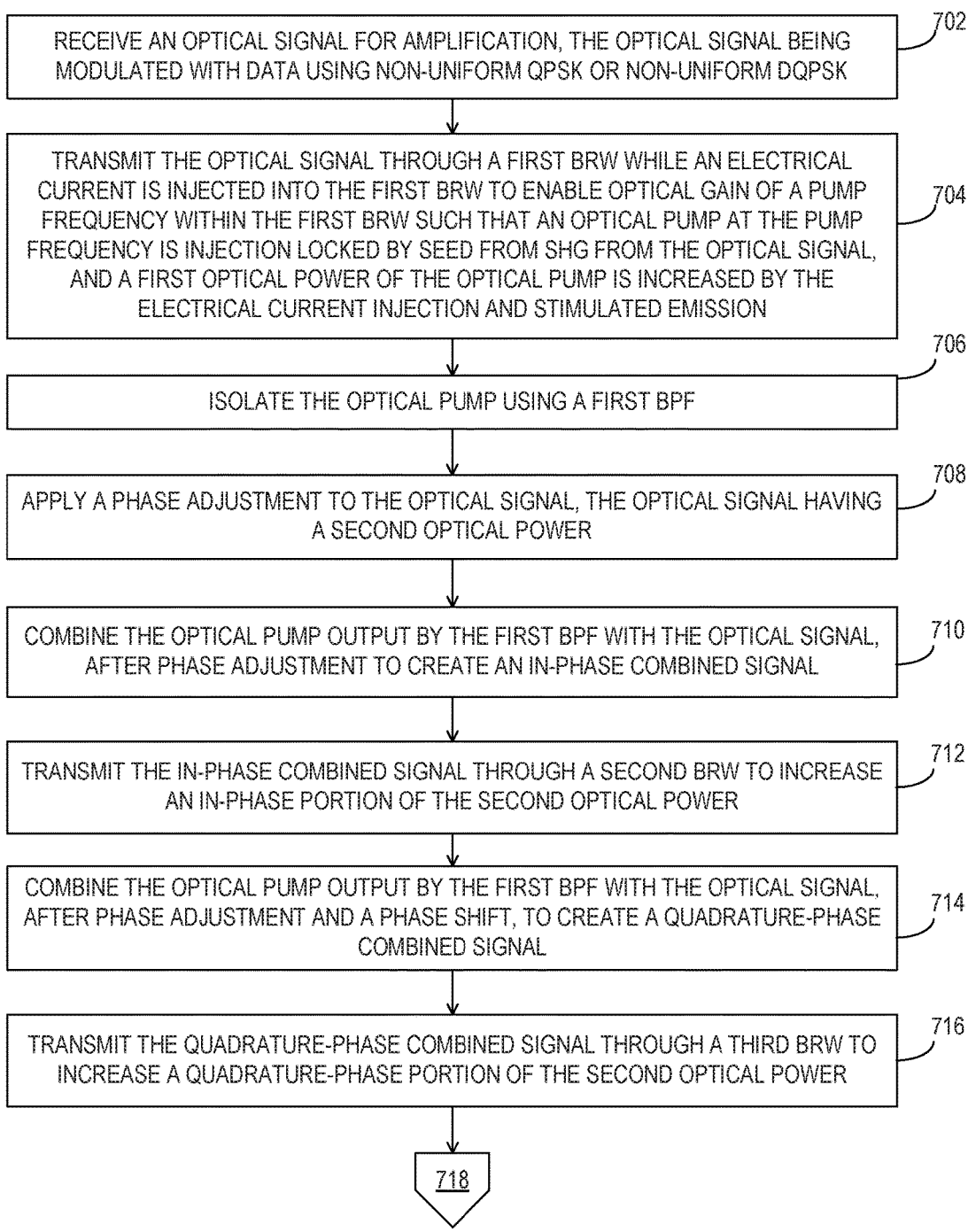
FIGS. 7A and 7B are a flow diagram of selected elements of an embodiment of a method for BRW phase-sensitive optical amplification.
Figure 7B:
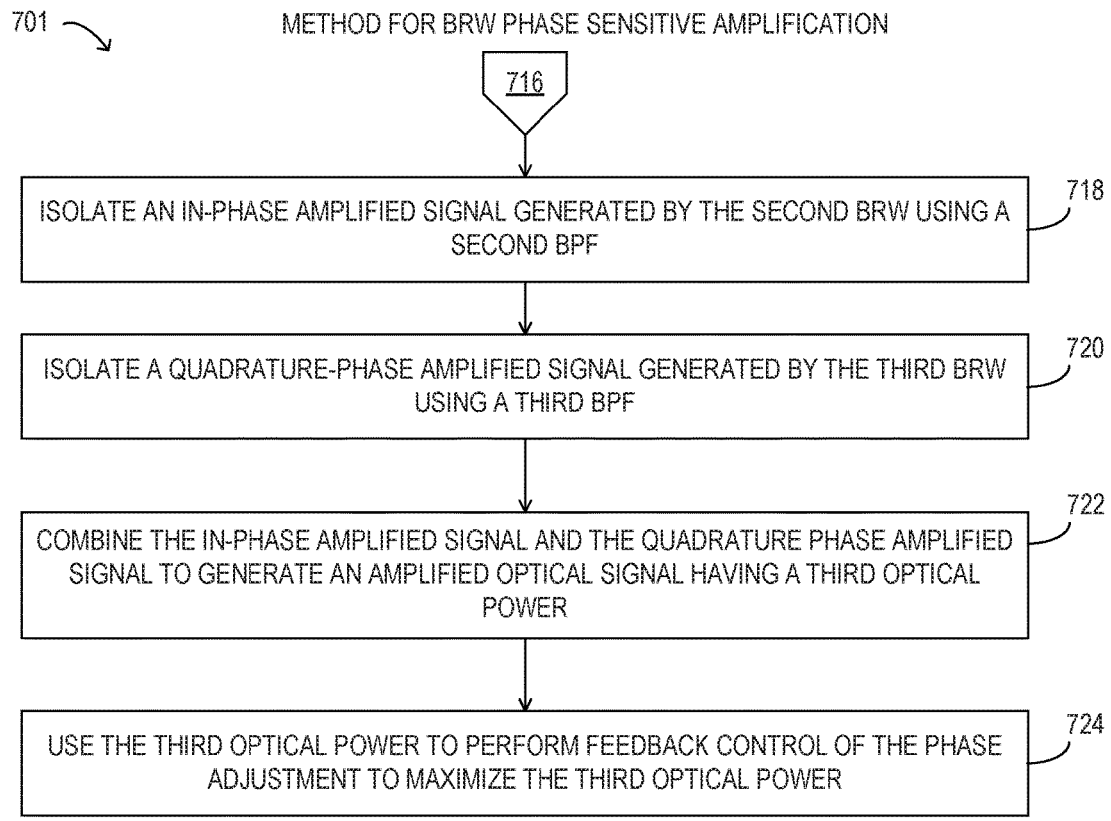

Referring now to FIGS. 7A and 7B, a block diagram of selected elements of an embodiment of methods 700 and 701 for BRW phase-sensitive amplification, as described herein, is depicted in flowchart form. Methods 700, 701 may be performed using BRW amplifier 400 in FIG. 4. It is noted that certain operations described in methods 700, 701 may be optional or may be rearranged in different embodiments.

In FIG. 7A, method 700 may begin at step 702 by receiving an optical signal for amplification, the optical signal being modulated with data using non-uniform QPSK or non-uniform DQPSK. In particular embodiments, the non-uniform QPSK may use 90% QPSK and 10% BPSK. At step 704, the optical signal is transmitted through a first BRW while an electrical current is injected into the first BRW to enable optical gain of a pump frequency within the first BRW such that an optical pump at the pump frequency is injection locked by seed from SHG from the optical signal, and a first optical power of the optical pump is increased by the electrical current injection and stimulated emission. At step 706, the optical pump may be isolated using a first bandpass filter. At step 708, a phase adjustment is applied to the optical signal, the optical signal having a second optical power. At step 710, the optical pump output by the first bandpass filter is combined with the optical signal, after phase adjustment to create an in-phase combined signal. At step 712, the in-phase combined signal is transmitted through a second BRW to increase an in-phase portion of the second optical power. At step 714, the optical pump output by the first bandpass filter is combined with the optical signal, after phase adjustment and a phase shift, to create a quadrature-phase combined signal. At step 716, the quadrature-phase combined signal is transmitted through a third BRW to increase a quadrature-phase portion of the second optical power. After step 716, method 700 may proceed with method 701 in FIG. 7B.

In FIG. 7B, method 701 may begin at step 718 by isolating an in-phase amplified signal generated by the second BRW using a second bandpass filter. At step 720, a quadrature-phase amplified signal generated by the third BRW is isolated using a third bandpass filter. At step 722, the in-phase amplified signal and the quadrature phase amplified signal are combined to generate an amplified optical signal having a third optical power. At step 724, the third optical power is used to perform feedback control of the phase adjustment to maximize the third optical power.

As disclosed herein, methods and systems enable amplifying optical signals using a Bragg reflection waveguide (BRW) having second order optical nonlinearity to generate an optical pump by injection locking. The BRW may also be used for parametric amplification of optical signals using the optical pump. Feedback phase-power control may be performed to maximize output power.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for amplifying optical signals, comprising:
   receiving an optical signal for amplification, the optical signal being modulated with data using binary phase shift keying or differential phase shift keying;
   transmitting the optical signal through a first Bragg reflection waveguide (BRW) having second order optical nonlinearity while an electrical current is injected into the first BRW to enable optical gain of a pump frequency within the first BRW, wherein within the first BRW:
   an optical pump at the pump frequency is injection locked by seed from second harmonic generation from the optical signal, wherein the optical pump does not include the data modulated; and
   a first optical power of the optical pump is increased by the electrical current injected and stimulated emission;
   isolating the optical pump generated by the first BRW using a first bandpass filter;
   combining the optical pump isolated with the optical signal, wherein a phase adjustment is applied to the optical signal to create a combined signal and the optical signal has a second optical power in the combined signal; and
   transmitting the combined signal through a second BRW having second order optical nonlinearity, wherein the second optical power of the optical signal is increased.

2. The method of claim 1, further comprising:
   isolating the optical signal having the second optical power increased using a second bandpass filter; and
   measuring the second optical power output by the second bandpass filter.

3. The method of claim 2, further comprising:
   using the second optical power measured to perform feedback control of the phase adjustment to maximize the second optical power.

4. An optical amplifier, comprising:
   a first stage to generate a combined signal, the first stage further comprising:
   a first Bragg reflection waveguide (BRW) having second order optical nonlinearity for receiving an optical signal for amplification, the optical signal being modulated with data using binary phase shift keying or differential phase shift keying, wherein the optical signal is transmitted through the first BRW while an electrical current is injected into the first BRW, and wherein within the first BRW:
   an optical pump at a pump frequency for the optical signal is injection locked by seed from second harmonic generation from the optical signal, wherein the optical pump does not include the data modulated; and
   a first optical power of the optical pump is increased by the electrical current injected and stimulated emission;
   a first bandpass filter for isolating the optical pump generated by the first BRW;
   a phase delay control applied to the optical signal along a separate optical path from the first BRW;
   an optical coupler to combine the optical pump isolated with the optical signal output from the phase delay control to generate the combined signal, wherein the optical signal has a second optical power in the combined signal; and
   a second stage further comprising:
   a second BRW having second order optical nonlinearity for receiving the combined signal, wherein the second optical power of the optical signal is increased in the second BRW.

5. The optical amplifier of claim 4, wherein the second stage further comprises:
   a second bandpass filter for isolating the optical signal generated by the second BRW; and
   a photodetector to measure the second optical power output by the second bandpass filter.

6. The optical amplifier of claim 5, further comprising:
   a feedback control loop using the second optical power measured to control the phase delay control to maximize the second optical power.

7. A method for amplifying optical signals, comprising:
   receiving an optical signal for amplification, the optical signal being modulated with data using non-uniform quadrature phase shift keying or non-uniform differential quadrature phase shift keying;

transmitting the optical signal through a first Bragg reflection waveguide (BRW) having second order optical nonlinearity while an electrical current is injected into the first BRW to enable optical gain of a pump frequency within the first BRW, wherein within the first BRW:
  an optical pump at the pump frequency is injection locked by seed from second harmonic generation from the optical signal; and
  a first optical power of the optical pump is increased by the electrical current injected and stimulated emission;
isolating the optical pump generated by the first BRW using a first bandpass filter;
applying a phase adjustment to the optical signal received, wherein the optical signal has a second optical power;
combining the optical pump output by the first bandpass filter with the optical signal after phase adjustment to create an in-phase combined signal;
transmitting the in-phase combined signal through a second BRW having second order optical nonlinearity to increase an in-phase portion of the second optical power;
combining the optical pump output by the first bandpass filter with the optical signal after phase adjustment and a phase shift to create a quadrature-phase combined signal; and
transmitting the quadrature-phase combined signal through a third BRW having second order optical nonlinearity to increase a quadrature-phase portion of the second optical power.

8. The method of claim 7, further comprising:
isolating an in-phase amplified signal generated by the second BRW using a second bandpass filter;
isolating a quadrature-phase amplified signal generated by the third BRW using a third bandpass filter;
combining the in-phase amplified signal and the quadrature phase amplified signal to generate an amplified optical signal having a third optical power; and
measuring the third optical power from the amplified optical signal.

9. The method of claim 8, further comprising:
using the third optical power measured to perform feedback control of the phase adjustment to maximize the third optical power.

10. The method of claim 7, wherein the non-uniform quadrature phase shift keying comprises quadrature phase shift keying and binary phase shift keying, and wherein the non-uniform differential quadrature phase shift keying comprises differential quadrature phase shift keying and differential phase shift keying.

11. An optical amplifier, comprising:
a first stage comprising:
  a first Bragg reflection waveguide (BRW) having second order optical nonlinearity for receiving an optical signal for amplification, the optical signal being modulated with data using non-uniform quadrature phase shift keying or non-uniform differential quadrature phase shift keying, wherein the optical signal is transmitted through the first BRW while an electrical current is injected into the BRW, and wherein within the first BRW:
    an optical pump at the pump frequency is injection locked by seed from second harmonic generation from the optical signal; and
    a first optical power of the optical pump is increased by the electrical current injected and stimulated emission;
  a first bandpass filter for isolating the optical pump generated by the first BRW; and
  a phase delay control applied to the optical signal along a separate optical path from the first BRW, wherein the optical signal has a second optical power;
a second stage further comprising:
  a first optical coupler to combine the optical pump output by the first bandpass filter with the optical signal output from the phase delay control to generate an in-phase combined signal;
  a second BRW having second order optical nonlinearity for receiving the in-phase combined signal, wherein an in-phase portion of the second optical power is increased in the second BRW;
  a second optical coupler to combine the optical pump output by the first bandpass filter with the optical signal output from the phase delay control and subject to a phase shift to generate an quadrature-phase combined signal; and
  a third BRW having second order optical nonlinearity for receiving the quadrature-phase combined signal, wherein a quadrature-phase portion of the second optical power is increased in the third BRW.

12. The optical amplifier of claim 11, further comprising:
a second bandpass filter for isolating an in-phase amplified signal generated by the second BRW;
a third bandpass filter for isolating a quadrature-phase amplified signal generated by the third BRW;
a second optical coupler to combine the in-phase amplified signal and the quadrature phase amplified signal to generate an amplified optical signal having a third optical power; and
a photodetector to measure the third optical power.

13. The optical amplifier of claim 12, further comprising:
a feedback control loop using the third optical power measured to control the phase delay control to maximize the third optical power.

14. The optical amplifier of claim 11, wherein the non-uniform quadrature phase shift keying comprises quadrature phase shift keying and binary phase shift keying, and wherein the non-uniform differential quadrature phase shift keying comprises differential quadrature phase shift keying and differential phase shift keying.

* * * * *